US011768243B2

(12) United States Patent
Chen et al.

(10) Patent No.: US 11,768,243 B2
(45) Date of Patent: Sep. 26, 2023

(54) METHOD FOR DETERMINING A GAIN ERROR OF A CURRENT MEASURING DEVICE

(71) Applicant: Robert Bosch GmbH, Stuttgart (DE)

(72) Inventors: Yuping Chen, Markgroeningen (DE); Gunther Goetting, Stuttgart (DE); Lei Chen, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 205 days.

(21) Appl. No.: 17/418,872

(22) PCT Filed: Dec. 19, 2019

(86) PCT No.: PCT/EP2019/086301
§ 371 (c)(1),
(2) Date: Jun. 28, 2021

(87) PCT Pub. No.: WO2020/136076
PCT Pub. Date: Jul. 2, 2020

(65) Prior Publication Data
US 2022/0074992 A1  Mar. 10, 2022

(30) Foreign Application Priority Data

Dec. 27, 2018 (DE) ...................... 10 2018 251 746.0

(51) Int. Cl.
*G01R 31/34* (2020.01)
*H02P 21/22* (2016.01)
(Continued)

(52) U.S. Cl.
CPC ......... *G01R 31/34* (2013.01); *G01R 19/0092* (2013.01); *G01R 31/2829* (2013.01); *H02P 21/22* (2016.02)

(58) Field of Classification Search
CPC ...... G01R 31/34; G01R 31/343; G01R 19/00; G01R 19/0092; G01R 31/28;
(Continued)

(56) References Cited

U.S. PATENT DOCUMENTS

2009/0189553 A1 * 7/2009 Arnet ...................... H02P 21/22
 318/400.3
2016/0276969 A1 * 9/2016 Krefta .................. G01R 35/005

FOREIGN PATENT DOCUMENTS

JP  2011087395 A  *  4/2011

OTHER PUBLICATIONS

Translation of International Search Report for Application No. PCT/EP2019/086301 dated Mar. 26, 2020 (1 page).
(Continued)

*Primary Examiner* — Son T Le
(74) *Attorney, Agent, or Firm* — Michael Best & Friedrich LLP (57) ABSTRACT

The invention relates to a method for determining a gain error of at least one current measuring device (8, 9, 10) of a sensor unit (7) of an electric machine (1), wherein the machine (1) has a stator winding (2) having at least three phases (U, V, W) and a rotor (5) which is mounted so as to be rotatable about an axis of rotation (6). According to the invention, an electric sensor voltage (11) is applied to the phases (U, V, W), the sensor voltage (11) having at least a first voltage pulse (12) of a first voltage vector and a second voltage pulse (13) of a second voltage vector, the first voltage vector and the second voltage vector being oriented in different directions in each case perpendicularly to the axis of rotation (7), at least one first current value of a first of the phases (U), at least one second current value of a second of the phases (V) and at least one third current value of a third of the phases (W) are detected during the appli-
(Continued)

cation of the sensor voltage (11), a sum current vector is determined on the basis of the detected current values of all of the phases (U, V, W), and the sum current vector is compared with at least one determined or stored reference current vector, at least one gain error being determined on the basis of the comparison.

14 Claims, 4 Drawing Sheets

(51) Int. Cl.
*G01R 19/00* (2006.01)
*G01R 31/28* (2006.01)

(58) Field of Classification Search
CPC ......... G01R 31/2829; H02P 6/16; H02P 6/28; H02P 21/22
See application file for complete search history.

(56) References Cited

OTHER PUBLICATIONS

Harke et al., "Current Measurement Gain Tuning Using High-Frequency Signal Injection", IEEE Transactions on Industry Applications, vol. 44, No. 5, 2008, pp. 1578-1586.

Harke et al., The Spatial Effect and Compensation of Current Sensor Differential Gains for Three-Phase Three-Wire Systems, IEEE Transactions on Industry Applications, vol. 44, No. 4, 2008, pp. 1181-1189.

* cited by examiner

METHOD FOR DETERMINING A GAIN ERROR OF A CURRENT MEASURING DEVICE

BACKGROUND OF THE INVENTION

The invention relates to a method for ascertaining a gain error of a current measuring device of a sensor unit of an electrical machine, wherein the machine comprises a stator winding with at least three phases and a rotor that is mounted rotatably about an axis of rotation.

The invention also relates to an apparatus for carrying out the method referred to at the beginning.

Electrical machines of the type mentioned at the beginning are known from the prior art. Electrical drive machines of electric vehicles or hybrid vehicles usually comprise a stator winding with at least three phases and a rotor that is mounted rotatably about an axis of rotation and that can be driven or rotated by a suitable supply of current to the phases for the generation of a torque.

In order to ensure an advantageous supply of current to the phases for driving the rotor, it is necessary to acquire an electrical current through the phases while the phases are being supplied. This is, for example, achieved by a sensor unit that comprises at least three current measuring devices, wherein each of the current measuring devices for acquiring the current through the phases is assigned to a different phase. Usually the acquired current is amplified. A value of the current, that is to say an input value, is increased here in accordance with an in particular proportional relationship, so that an output value is greater than the input value. Gain errors can occur during this amplification. A gain error is to be understood to mean that an actual function for generating the output value from the input value deviates from an ideal or expected function, so that the actual output value is larger or smaller than the ideal or expected output value. To acquire or to rectify gain errors, the publication "*The Spatial Effect and Compensation of Current Sensor Differential Gains for Three-Wire Systems*" (DOI: 10.1109/TIA.2008.926208) proposes acquiring a positive sequence component of a working current for driving a rotor and of calibrating the gain depending on the positive sequence components.

SUMMARY OF THE INVENTION

The method of the invention has the advantage that a reliable ascertainment of gain errors is enabled. In particular, gain errors can be acquired even when the rotor is stationary. According to the invention it is provided for this purpose that in a step a) an electrical sensor voltage is applied to the phases, wherein the sensor voltage comprises at least one first voltage pulse with a first voltage vector and one second voltage pulse with a second voltage vector, wherein the first voltage vector and the second voltage vector are each oriented in different directions perpendicular to the axis of rotation, that in a step b) during the application of the sensor voltage, at least one first current value of a first of the phases, at least one second current value of a second of the phases and at least one third current value of a third of the phases is acquired, that in a step c) a sum current vector is ascertained depending on the acquired current values of all of the phases, and that in a step d) the sum current vector is compared with at least one ascertained or stored reference current vector, wherein, depending on the comparison, at least one gain error is ascertained. A voltage pulse here refers to an applied voltage that has at least one maximum value and one minimum value. In order to achieve a desired orientation of the first voltage vector and of the second voltage vector of the sensor voltage, a voltage is applied simultaneously to multiple phases. The different orientations of the first voltage pulse and the second voltage pulse are referred to a two-axis coordinate system extending perpendicular to the axis of rotation. This is in particular a stationary coordinate system, i.e. a coordinate system assigned to the phases which are also stationary. The sensor voltage applied to the phases brings about a current through the phases, i.e. a sensor current, which is acquired by the current measuring devices. Current values of all the phases are ascertained to ascertain the sum current vectors.

It is provided according to one preferred embodiment, that at least one first partial sum current vector is ascertained depending on the first current value and the second current value, at least one second partial sum current vector is ascertained depending on the first current value and the third current value and/or at least one third partial sum current vector is ascertained depending on the second current value and the third current value, as a reference current vector in each case. Thus to ascertain the partial sum current vectors, only current values from two of the phases are taken into consideration in each case. The current value of one of the phases in each case is accordingly excluded from the ascertainment of the partial sum current vectors. In the comparison, an orientation of the sum current vector is then preferably compared with an orientation of at least one of the partial sum current vectors. Unbalanced gain errors are in particular ascertained through the method. This is to be understood to refer to gain errors that do not affect the current values of all phases equally. The unbalanced gain errors appear in such a way that the orientation of at least one of the partial sum current vectors does not accord with an expected orientation.

According to one preferred embodiment, it is provided that in the step d) at least two of the partial sum current vectors are ascertained. In the step f), both of the ascertained partial sum current vectors are then each compared with the sum current vector. The advantage emerges from this that unbalanced gain errors of each of the current measuring devices can be ascertained by the method.

Advantageously the sensor voltage is applied in such a way that the first voltage vector and the second voltage vector are oriented perpendicularly to one another. The sensor voltage configured in this way is on the one hand technically easy to apply to the phases. On the other hand, an uncomplicated evaluation of the acquired current values results from a sensor voltage applied in this way for ascertainment of a gain error.

A development of the invention provides that the sensor voltage is applied in such a way that the first voltage pulse comprises at least one first oscillation and the second voltage pulse comprises at least one second oscillation. Oscillation is to be understood here to mean that the voltage values of the voltage pulse oscillate about a mean or zero value. The first oscillation and the second oscillation here each comprise at least one period.

Preferably the sensor voltage is applied in such a way that the first oscillation and the second oscillation follow one another in time, in particular follow one another immediately. The sensor voltage is thus specified in such a way that the first oscillation and the second oscillation do not mutually overlay. As a result, the evaluation of the acquired current values, or the ascertainment of a gain error, is simplified.

Preferably the sensor voltage is applied in such a way that an amplitude of the first oscillation corresponds to an amplitude of the second oscillation. In this way the evaluation of the acquired current values is again simplified.

According to a preferred embodiment, the first voltage pulse and/or the second voltage pulse are/is applied as a pulse-width modulated voltage. The first oscillation and/or the second oscillation are thus a rectangular oscillation. On the one hand, the pulse-width modulated voltage can easily be specified or applied. On the other hand, by means of pulse-width modulation, oscillations with high frequencies, in particular high-frequency oscillations, can be achieved, which is advantageous for carrying out the method, as will be explained later.

Preferably, multiple first current values, multiple second current values and multiple third current values are acquired at sequential time points. Through the acquisition of multiple current values in each case, the accuracy of the method is increased. Preferably, a first current value, a second current value and a third current value are acquired at each of the sequential time points. Current values are preferably acquired at a zero time point, wherein at the zero time point, a transition from a zero value of the first voltage pulse to the maximum value of the first voltage pulse, and a transition from the maximum value of the second voltage pulse to a zero value of the second voltage pulse take place. Alternatively or in addition, current values are preferably acquired at a first time point, wherein a transition from the maximum value of the first voltage pulse to the minimum value of the first voltage pulse takes place at the first time point and the second voltage pulse has the zero value. Alternatively or in addition, current values are preferably acquired at a third time point, wherein at the third time point a transition from the minimum value of the first voltage pulse to the maximum value of the first voltage pulse takes place, and the second voltage pulse has the zero value. Alternatively or in addition, current values are preferably acquired at a fourth time point, wherein at the fourth time point a transition from the maximum value of the first voltage pulse to the zero value of the first voltage pulse, and a transition from the zero value of the second voltage pulse to the maximum value of the second voltage pulse take place. Alternatively or in addition, current values are preferably acquired at a fifth time point, wherein at the fifth time point, the first voltage pulse has the zero value, and a transition from the maximum value of the second voltage pulse to the minimum value of the second voltage pulse takes place. Alternatively or in addition, current values are preferably acquired at a seventh time point, wherein at the seventh time point the first voltage pulse has the zero value and a transition from the minimum value of the second voltage pulse to the maximum value of the second voltage pulse takes place. The zero value is to be understood here to mean that its voltage magnitude corresponds to the mean value of the voltage magnitudes of the maximum and of the minimum of the respective voltage pulse. Preferably the magnitude of the zero value is 0, so that no voltage is present in the presence of the zero value.

According to a preferred embodiment, it is provided that the sensor voltage is modulated onto a working voltage for driving the rotor. A working voltage is to be understood to refer to a voltage that is applied to the phases in order to drive the rotor. The sensor voltage is modulated onto the rotor voltage, so that the two voltages overlay, i.e. are present in the phases simultaneously. This gives rise to the advantage that an effect of a rotor angle of the rotor on the ascertainment of the gain error can be excluded by means of a low-pass filter.

Preferably the sensor voltage is applied in such a way that the first and/or the second oscillation have/has a frequency that is greater, in particular significantly greater, than a frequency of the working voltage. Preferably, the sensor voltage is configured such that the frequency of the first and/or the second voltage is greater than the frequency of the working voltage in such a way that it is possible to assume that a change in the working current during a first oscillation or during the second oscillation has a constant gradient. Through such an application of the sensor voltage, an evaluation of the acquired current values, and thus the ascertainment of a gain error, is simplified.

According to a preferred embodiment it is provided that at least one stored reference sum current vector that corresponds to an expected sum current vector during fault-free operation of the sensor unit is compared as a reference current vector. The advantage that balanced gain errors can be ascertained emerges from this. A balanced gain error is to be understood to refer to an error that has the effect that the current values of all the phases that are acquired are amplified in an identically faulty manner. Preferably a magnitude of the sum current vector is compared with a magnitude of the reference sum current vector to ascertain the balanced gain error.

Preferably at least one correction factor used to amplify the acquired current values is adjusted when ascertaining a gain error. Through the adjustment of the correction factor, the gain error is reduced. An efficiency in the operation of the electrical machine is thereby increased.

The invention also relates to an apparatus for ascertaining a gain error of at least one current measuring device of a sensor unit of an electrical machine, wherein the machine comprises a stator winding with at least three phases, at least one current and/or voltage source connected to each of the phases, and a rotor that is mounted rotatably about an axis of rotation, wherein the sensor unit comprises at least three current measuring devices, wherein each of the current measuring devices is respectively assigned to a different one of the phases. The apparatus is characterized by the features of claim 14 through its design as a control device and in that the control device is in particular set up to carry out the method of the invention when used as intended. The advantages already referred to also emerge from this. Further preferred features and feature combinations emerge from what has already been described and from the claims.

BACKGROUND OF THE INVENTION

The invention is explained in more detail below with reference to the drawings, wherein elements that are identical or that correspond are given the same reference signs in the figures, in which.

DETAILED DESCRIPTION

Figure 1:
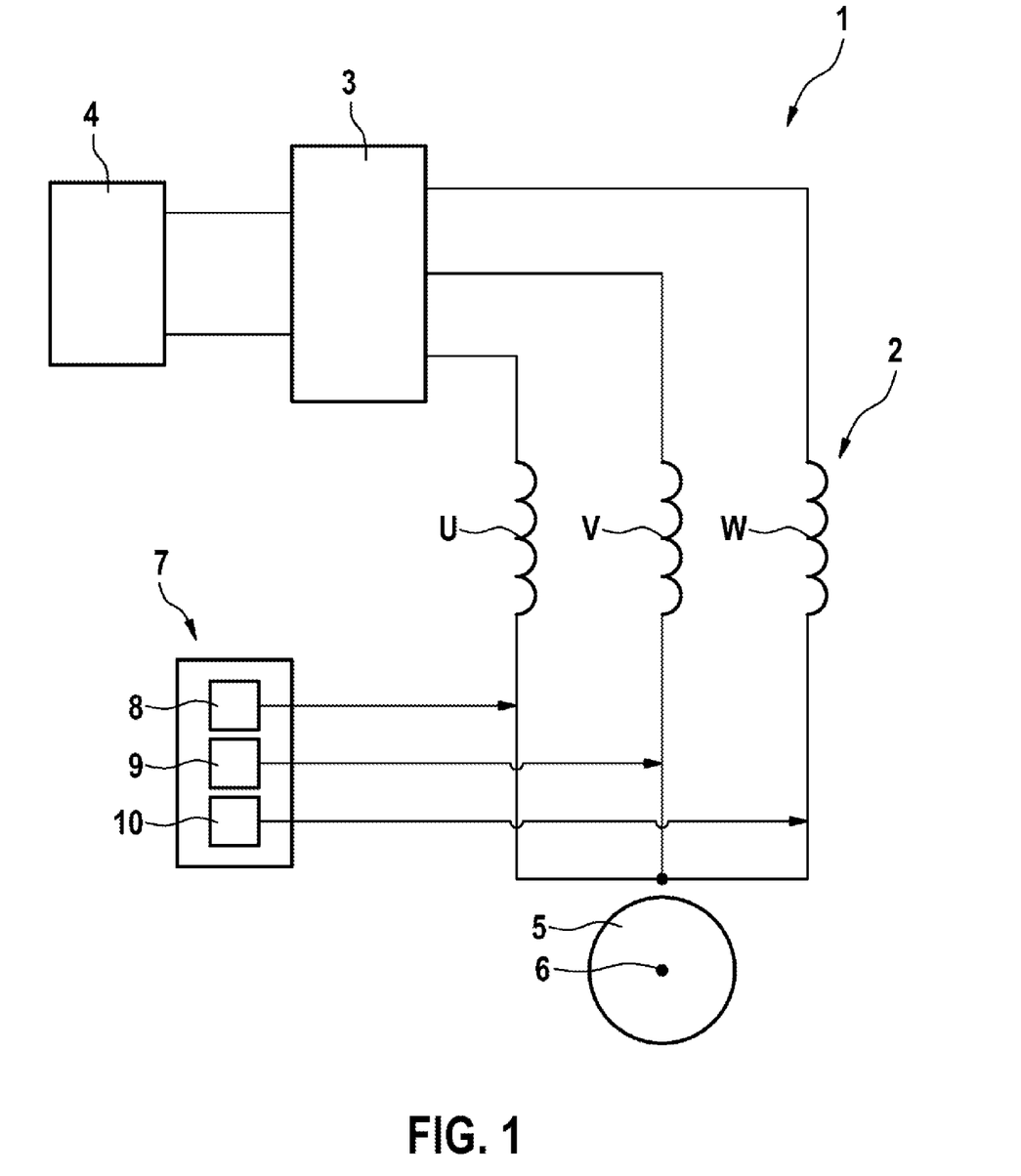
FIG. 1 shows an electrical machine with a sensor unit.

FIG. 1 shows, in a schematic illustration, an electrical machine 1. The machine 1 is, for example, an electrical drive machine of a vehicle, not illustrated. The machine 1 comprises a stator winding 2 with a first phase U, a second phase V and a third phase W. The phases U, V and W are connected through power electronics 3 to a voltage source 4, in this case a traction battery of the vehicle, so that by means of the voltage source 4, the phases U, V and W are supplied with current. The electrical machine 1 also comprises a rotor 5 that is mounted rotatably about an axis of rotation 6. For the sake of clarity, the phases U, V and W in FIG. 1 are shown next to one another and above the rotor 5. In fact, however, the phases are distributed around the rotor 5 in such a way that the rotor 5 can be driven or rotated through a suitable supply of current to the phases U, V and W.

The electrical machine 1 also comprises a sensor unit 7. The sensor unit 7 comprises in the present case three current measuring devices 8, 9 and 10. The current measuring devices 8, 9 and 10 are each assigned to a different one of the phases U, V and W for acquisition of an electrical current through the phases U, V and W. According to FIG. 1, a first current measuring device 8 is assigned to the first phase U, a second current measuring device 9 to the second phase V and a third current measuring device 10 to the third phase W. It is provided here that the acquired current is amplified. Gain errors can occur when amplifying the current values. These have the effect that an amplified current value that is output, i.e. an output value, does not correspond to the expected value. The output value here is larger or smaller than the expected value. In this case a faulty amplification thus takes place.

Figure 2:
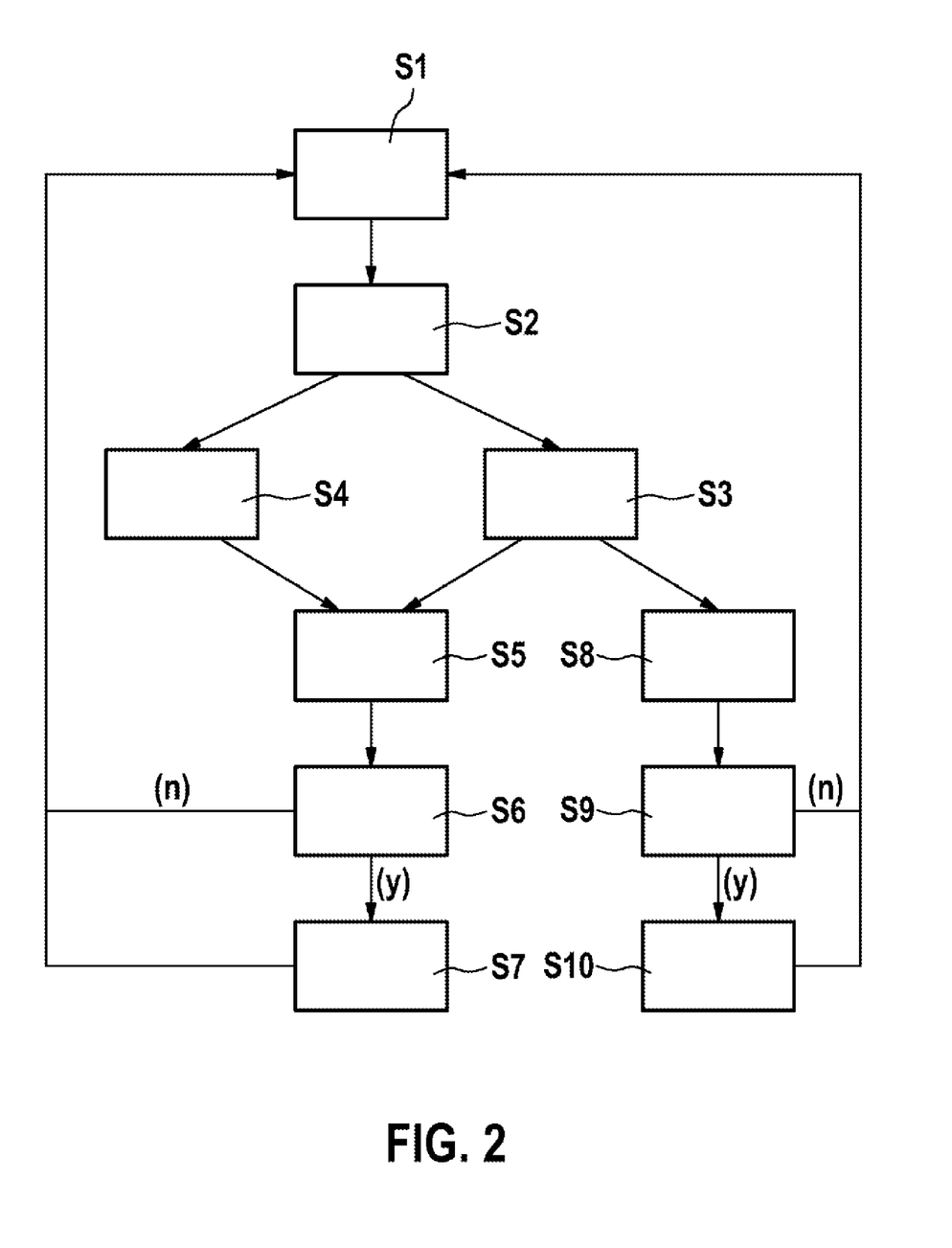
FIG. 2 shows a method for ascertaining a gain error of at least one current measuring device of the sensor unit.
Figure 3:
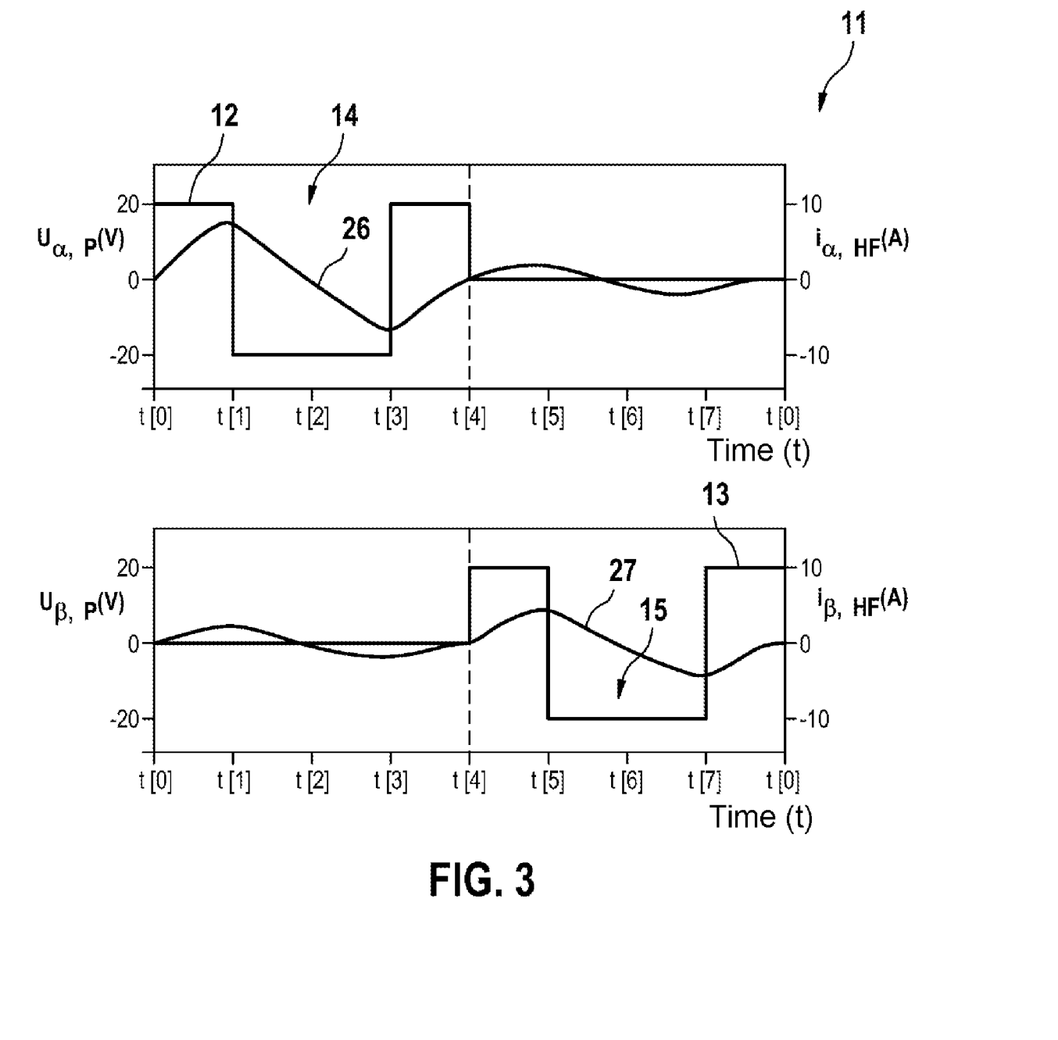
FIG. 3 shows a profile of a sensor current applied to one of the phases of the machine.

A method for ascertaining a gain error is explained below with reference to FIG. 2. FIG. 2 shows the method on the basis of a flow diagram. In a step S1 a sensor voltage 11 (test voltage) is applied to the phases U, V and W. This is, for example, done by means of the voltage source 4. Alternatively, a further current and/or voltage source is present for applying the sensor voltage 11 (test voltage) to the phases U, V and W. The configuration of the applied sensor voltage 11 is illustrated in FIG. 3. This shows, in an upper part of FIG. 3, a first voltage pulse 12 of the sensor voltage 11, and a current profile 26 resulting from the first voltage pulse 12. In a lower part of FIG. 3, a second voltage pulse 13 of the sensor voltage 11, and a current profile 27 resulting from the second voltage pulse 13, are illustrated. The first voltage pulse 12 comprises a first oscillation 14. The second voltage pulse 13 analogously comprises a second oscillation 15. The first oscillation 14 and the second oscillation 15 follow each other immediately. In the present case the first oscillation 14 extends over a period of time between a zeroed time point t[0] and a fourth time point t[4]. The second oscillation 15 extends over a period of time between the fourth time point t[4] and the zeroed time point t[0]. As can be seen in FIG. 3, the first oscillation 14 extends over a period of time that is equal to the second oscillation 15. The first oscillation 14 additionally has an amplitude that corresponds to an amplitude of the second oscillation 15. Both oscillations 14 and 15 are, furthermore, each symmetrical with respect to their central time point. This means that the first oscillation 14 is symmetrical about the time point t[2] and the second oscillation 15 is symmetrical about the time point t[6]. The first voltage pulse 12 has a first voltage vector. The second voltage pulse 13 analogously has a second voltage vector. The two voltage vectors have different directions and are each oriented perpendicularly to the axis of rotation 6. In the present case, the first voltage vector is oriented in the direction of a first axis $\alpha$. The second voltage vector is oriented in the direction of a second axis $\beta$ that is perpendicular to the first axis $\alpha$. The two axes $\alpha$ and $\beta$ define a two-axis coordinate system extending perpendicularly to the axis of rotation 6. This is, in particular, a stationary coordinate system, i.e. a coordinate system assigned to the phases U, V and W. In summary, the oscillations 14 and 15, or the voltage pulses 12 and 13, are at least essentially of the same form, apart from the orientation of the voltage vectors and the period of time during which they are applied.

In a step S2 of the method illustrated in FIG. 2, at least one first current value of the first phase U, a second current value of the second phase V and a third current value of the third phase W are acquired during the application of the sensor voltage 11. Preferably, a first current value, a second current value and a third current value are each acquired at different time points. In the present case, a first current value, a second current value and a third current value are in each case acquired at least at the time points t[0], t[1], t[3], t[4], t[5] and t[7].

Preferably a working voltage to drive the rotor or to generate a torque in the phases U, V and W is also applied in the step S1 at the same time as the sensor voltage 11. To ascertain gain errors, a current 26, 27 brought about by the sensor voltage 11 is extracted from an acquired total current. Thus only that part of the total current that is brought about by the applied sensor voltage 11 is taken into consideration when ascertaining gain errors.

Depending on the acquired current values of all the phases, a sum current vector is ascertained in a step S3. In the present case the following formulae (1.1), (1.2) and (1.3) are used for this purpose.

$$\Delta \underline{i}_{\alpha\beta,HF,\Sigma 1} = \frac{1}{4}(2 \times \underline{i}_{\alpha\beta}[1] - 2 \times \underline{i}_{\alpha\beta}[3] - \underline{i}_{\alpha\beta}[0] + \underline{i}_{\alpha\beta}[4]) \quad (1.1)$$

$$\Delta \underline{i}_{\alpha\beta,HF,\Sigma 2} = \frac{1}{4}(2 - \underline{i}_{\alpha\beta}[5] - 2 \times \underline{i}_{\alpha\beta}[7] - \underline{i}_{\alpha\beta}[4] + \underline{i}_{\alpha\beta}[0]) \quad (1.2)$$

$$\Delta \underline{i}_{\alpha\beta,HF,\Sigma} = \mathrm{LPF}\{\tfrac{1}{2} \times (\Delta \underline{i}_{\alpha\beta,HF,\Sigma 1} + e^{-j\pi/2} \times \Delta \underline{i}_{\alpha\beta,HF,\Sigma 2})\} \quad (1.3)$$

The term $\underline{i}_{\alpha\beta}[k]$ here describes an acquired or ascertained current vector at the time point t[k]. LPF indicates a low pass filter used when ascertaining the sum current vector. The sum current vector is described by the term $\Delta \underline{i}_{\alpha\beta,HF,\Sigma}$. To ascertain the sum current vector, the current values of all the phases U, V and W acquired at the time point t[k] are in each case taken into consideration in the ascertainment of the current vectors $\underline{i}_{\alpha\beta}[k]$.

At least one partial sum current vector is ascertained in a step S4. Two partial sum current vectors are ascertained in the present case. Analogously to the sum current vector, the partial sum current vectors are also ascertained by means of the formulae (1.1), (1.2) and (1.3), and are described by the term $\Delta \underline{i}_{\alpha\beta,HF,\Sigma}$. However, in contrast to the sum current vector, the respective acquired current values of all the phases U, V and W are not taken into consideration when ascertaining the partial sum current vectors. In the present case, a first partial sum current vector is ascertained depending on the acquired current values of the first phase U and the acquired current values of the second phase V. Only the current values of these phases U and V are taken into consideration for this purpose when ascertaining the current vectors $\underline{i}_{\alpha\beta}[k]$. In addition, a second partial sum current vector is ascertained depending on the acquired current values of the first phase U and of the third phase W. Only the current values of these phases U and W are taken into consideration for this purpose when ascertaining the current vectors $\underline{i}_{\alpha\beta}[k]$. In addition or alternatively to the first partial sum current vector or the second partial sum current vector, a third partial sum current vector is preferably ascertained, wherein the third partial sum current vector is ascertained depending on the acquired current values of the phases V and W.

In a step S5, the sum current vector is compared with the partial sum current vectors. An orientation of the sum current vector is, for example, compared with an orientation of the first partial sum current vector, or an orientation of the second partial sum current vector. Whether a gain error is present is established in a step S6 depending on the comparison. It is, for example, established that a gain error is present if the comparison shows that one of the partial sum current vectors has a faulty or unexpected orientation. If it is established that no gain error is present (n), control returns to step S1. If, however, it is established in the step S6 that a gain error is present (y), then measures are taken in a step S7 to rectify the gain error. For example, at least one correction factor used in the gain is adjusted to correct the gain error. Control returns again to step S1 after step S7.

In an optional step S8, the sum current vector is compared with a reference sum current vector. The reference sum current vector is a sum current vector ascertained during fault-free operation of the sensor unit 7. In the present case, a magnitude of the ascertained sum current vector is compared with a magnitude of the reference sum current vector in the step S8. Depending on the comparison carried out in the step S8, it is established in a step S9 whether a balanced gain error is present, i.e. a gain error that affects the current values acquired by the current measuring devices 8, 9 and 10 to an equal extent. If a balanced gain error is not present (n), control returns to step S1. If, however, a balanced gain error is established in step S9, the correction factors of the current measuring devices 8, 9 and 10 are adjusted in a step S10, and control then returns to step S1.

Figure 4:
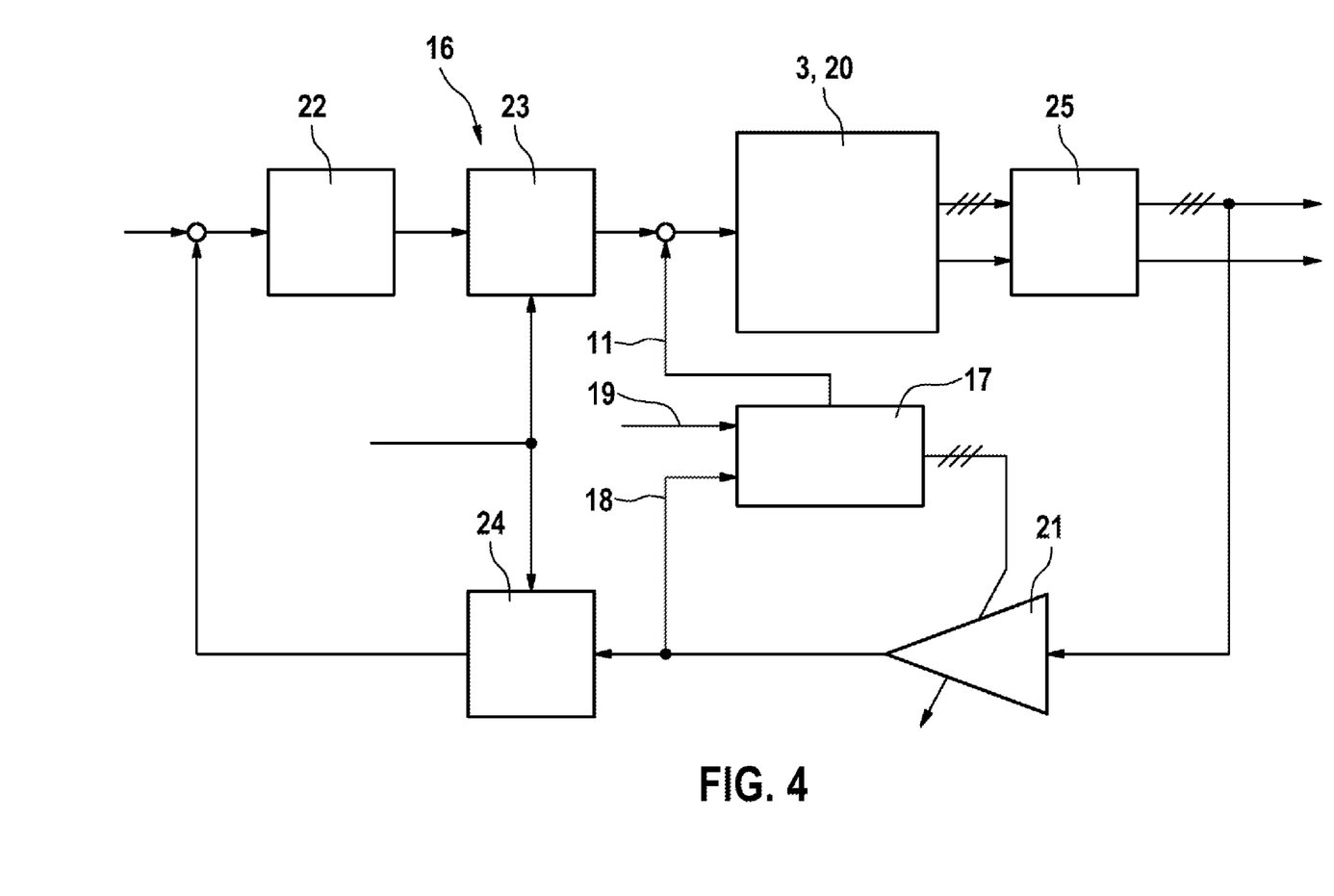
FIG. 4 shows a control loop with an apparatus for ascertaining the gain error.

FIG. 4 shows a control loop 16 with an apparatus 17 configured as a control device. The apparatus 17 is designed to carry out the method described with reference to FIG. 2, i.e. to ascertain at least one gain error. The current values 18 acquired and amplified by means of the current measuring devices 8, 9 and 10, i.e. the first current values, the second current values and the third current values, are made available to the apparatus 17. A reference sum current vector is also made available to the apparatus 17. A value 19 that describes a torque to be generated by the electrical machine 1 is furthermore made available to the apparatus 17. On the output side, the apparatus 17 is connected to the power electronics 3 or to a control device 20 for driving of the power electronics 3, and is designed to specify the sensor voltage 11 to be applied to the power electronics 3 or to the control device 20. The sensor voltage 11 here is preferably specified depending on the value 19. Additionally, the apparatus 17 is connected on the output side to a correction device 21 in which the current values of the correction factors are stored. The apparatus 17 is either designed to provide adjusted correction factors to the correction device, or to convey to the correction device 21 information, wherein the correction device 21 is designed to adjust the correction factors itself depending on the information. The control loop 16 also comprises a current regulator 22, a first coordinate transformation device 23 and a second coordinate transformation device 24. The first coordinate transformation device 23 is in particular designed to transform values of a rotating coordinate system into values of the stationary coordinate system. The second coordinate transformation device 24 is in particular designed to transform multiphase, in particular three-phase, values into a two-axis coordinate system. The control loop 16 furthermore comprises a sensor system 25. The sensor system comprises, for example, the sensor unit 7 as well as a measuring device that is designed to acquire an angle of rotation of the rotor 5.

The invention claimed is:

1. A method for ascertaining a gain error of a current measuring device (8, 9, 10) of a sensor unit (7) of an electrical machine (1), wherein the electrical machine (1) comprises a stator winding (2) with at least three phases (U, V, W) and a rotor (5) that is mounted rotatably about an axis of rotation (6), having the following steps:
   a) applying, with a voltage source (4), a test voltage (11) to the three phases (U, V, W), wherein the test voltage (11) comprises a first voltage pulse (12) with a first voltage vector and a second voltage pulse (13) with a second voltage vector, wherein the first voltage vector and the second voltage vector are each oriented in different directions perpendicular to the axis of rotation (6),
   b) acquiring, with the sensor unit (7), during the application of the test voltage (11), a first current value of a first phase (U) of the three phases (U, V, W), a second current value of a second phase (V) of the three phases (U, V, W), and a third current value of a third phase (W) of the three phases (U, V, W),
   c) ascertaining of a sum current vector based on the acquired current values of all of the three phases (U, V, W), and
   d) comparing the sum current vector with an ascertained or stored reference current vector, and ascertaining a gain error based on the comparison.

2. The method as claimed in claim 1, wherein a first partial sum current vector is ascertained based on the first current value and the second current value, a second partial sum current vector is ascertained based on the first current value and the third current value, and/or a third partial sum current vector is ascertained based on the second current value and the third current value, as a reference current vector in each case.

3. The method as claimed in claim 2, wherein at least two of the partial sum current vectors are ascertained.

4. The method as claimed in claim 1, wherein the test voltage (11) is applied in such a way that the first voltage vector and the second voltage vector are oriented perpendicularly to one another.

5. The method as claimed in claim 1, wherein the test voltage (11) is applied in such a way that the first voltage pulse (12) comprises a first oscillation (14) and/or the second voltage pulse (13) comprises a second oscillation (15).

6. The method as claimed in claim 5, wherein the test voltage (11) is applied in such a way that the first oscillation (14) and the second oscillation (15) follow one another in time.

7. The method as claimed in claim 5, wherein the test voltage (11) is applied in such a way that an amplitude of the first oscillation (14) corresponds to an amplitude of the second oscillation (15).

8. The method as claimed in claim 1, wherein the first voltage pulse (12) and/or the second voltage pulse (13) are/is applied as a pulse-width modulated voltage.

9. The method as claimed in claim 1, wherein multiple first current values, multiple second current values and multiple third current values are acquired at sequential time points.

10. The method as claimed in claim 1, wherein the test voltage (11) is modulated onto a working voltage for driving the rotor (5).

11. The method as claimed in claim 10, wherein the first and/or the second oscillation (14, 15) have/has a frequency that is greater than a frequency of the working voltage.

12. The method as claimed in claim 1, wherein a stored reference sum current vector that corresponds to an expected sum current vector during fault-free operation of the sensor unit (7) is used as a reference current vector.

13. The method as claimed in claim 1, wherein a correction factor used to amplify the acquired current values is adjusted when ascertaining a gain error.

14. An apparatus (17) for ascertaining a gain error of a current measuring device (8, 9, 10) of a sensor unit (7) of an electrical machine (1) having a stator winding (2) with three phases (U, V, W), a current and/or voltage source (4) connected to each of the three phases (U, V, W) and a rotor (5) that is mounted rotatably about an axis of rotation (6), wherein the sensor unit (7) includes three current measuring devices (8, 9, 10), wherein each of the current measuring devices (8, 9, 10) is respectively assigned to a different one of the three phases (U, V, W), and wherein the apparatus (17) is configured to a) apply, with a voltage source (4), a test voltage (11) to the three phases (U, V, W), wherein the test voltage (11) comprises at least one first voltage pulse (12) with a first voltage vector and one a second voltage pulse (13) with a second voltage vector, wherein the first voltage vector and the second voltage vector are each oriented in different directions perpendicular to the axis of rotation (6), b) acquire, with the sensor unit (7), during the application of the test voltage (11), a first current value of a first phase (U) of the three phases (U, V, W), a second current value of a second phase (V) of the three phases (U, V, W) and a third current value of a third phase (W) of the three phases (U, V, W), c) ascertain a sum current vector based on the acquired current values of all of the three phases (U, V, W), and d) compare the sum current vector with an ascertained or stored reference current vector, and ascertain a one a gain error based on the comparison.

* * * * *